(12) United States Patent
Xiong

(10) Patent No.: US 12,380,727 B1
(45) Date of Patent: Aug. 5, 2025

(54) DISPLAY PANEL AND DISPLAY DEVICE

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventor: Nana Xiong, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 18/758,190

(22) Filed: Jun. 28, 2024

(30) Foreign Application Priority Data

Feb. 7, 2024 (CN) .......................... 202410172754.9

(51) Int. Cl.
```
G06V 40/13      (2022.01)
G09G 3/32       (2016.01)
H01L 25/075     (2006.01)
H01L 25/16      (2023.01)
H10D 86/40      (2025.01)
H10D 86/60      (2025.01)
H10H 20/857     (2025.01)
```

(52) U.S. Cl.
CPC .......... *G06V 40/1318* (2022.01); *G09G 3/32* (2013.01); *H01L 25/0753* (2013.01); *H01L 25/167* (2013.01); *H10D 86/423* (2025.01); *H10D 86/441* (2025.01); *H10D 86/471* (2025.01); *H10D 86/60* (2025.01); *H10H 20/857* (2025.01); *G09G 2310/0286* (2013.01); *G09G 2310/08* (2013.01)

(58) Field of Classification Search
CPC ............. G06V 40/1318; H10D 86/471; H10D 86/441; H10D 86/60; H10D 86/423; H10H 20/857; G09G 3/32; G09G 2310/0286; G09G 2310/08; H01L 25/0753; H01L 25/167; H10K 59/40
See application file for complete search history.

(56) References Cited

U.S. PATENT DOCUMENTS

2023/0329066 A1* 10/2023 Lee .................. H10K 59/40

FOREIGN PATENT DOCUMENTS

| CN | 109801946 A | 5/2019 |
| CN | 111312174 A | 6/2020 |
| CN | 114613823 A | 6/2022 |

* cited by examiner

*Primary Examiner* — Abdul-Samad A Adediran
(74) *Attorney, Agent, or Firm* — Anova Law Group, PLLC

(57) ABSTRACT

A display panel and a display device are provided. The display panel includes: a display region and a non-display region at least partially surrounding the display region. The display region includes a plurality of sensor circuits. At least two sensor circuits in the plurality of sensor circuits include different types of transistors.

16 Claims, 11 Drawing Sheets

DISPLAY PANEL AND DISPLAY DEVICE

CROSS-REFERENCE TO RELATED APPLICATION

This application claims the priority of Chinese Patent Application No. 202410172754.9, filed on Feb. 7, 2024, the content of which is incorporated herein by reference in its entirety.

TECHNICAL FIELD

The present disclosure generally relates to the field of display technology and, more particularly, relates to a display panel and a display device.

BACKGROUND

Currently, most of the popular optical or ultrasonic recognition technologies in commercial use are plug-in, that is, a display screen and a sensor are combined through physical fit. Therefore, a large module space is occupied, which is not good for the thinning of the display device. The demand for embedded recognition technology in the industry is getting stronger and stronger. The existing embedded solutions only simply integrate the sensor and the display panel, and the resolution is relatively low, which does not meet the needs of the current market.

SUMMARY

One aspect of the present disclosure provides a display panel. The display panel includes: a display region and a non-display region at least partially surrounding the display region. The display region includes a plurality of sensor circuits. At least two sensor circuits in the plurality of sensor circuits include different types of transistors.

Another aspect of the present disclosure provides a display device. The display device includes a display panel. The display panel includes: a display region and a non-display region at least partially surrounding the display region. The display region includes a plurality of sensor circuits. At least two sensor circuits in the plurality of sensor circuits include different types of transistors.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
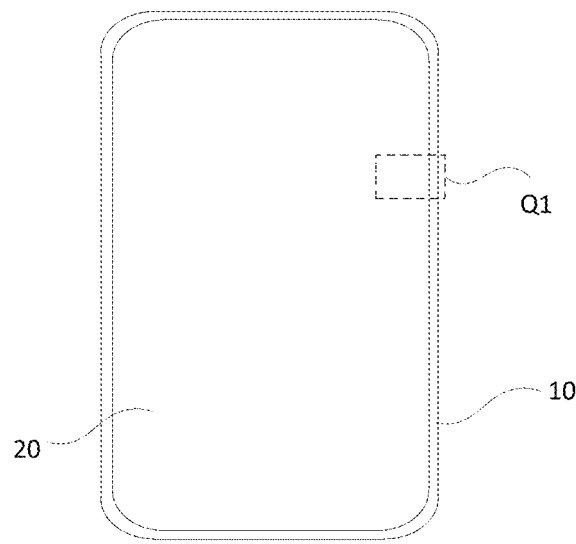
FIG. 1 illustrates an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In the present disclosure, relational terms such as first and second are only used to distinguish one entity or operation from another entity or operation, and do not necessarily require or imply any such actual relationship between these entities or operations or order. Moreover, the terms "including", "comprising" or any other variants thereof are intended to cover non-exclusive inclusion, such that a process, method, article, or device that includes a series of elements includes not only those elements, but also those that are not explicitly listed or also include elements inherent to this process, method, article or equipment. If there are no more restrictions, the elements defined by the sentence "including . . . " do not exclude the existence of other same elements in the process, method, article, or equipment that includes the elements.

It should be understood that when describing the structure of a component, when a layer or region is referred to as being "on" or "above" another layer or another region, the layer or region may be directly on the other layer or region, or indirectly on the other layer or region, for example, layers/components between the layer or region and another layer or another region. And, for example, when the component is reversed, the layer or region may be "below" or "under" the other layer or region. In the present disclosure, the term "electrical connection" refers to that two components are directly electrically connected with each other, or the two components are electrically connected via one or more other components.

Figure 2:
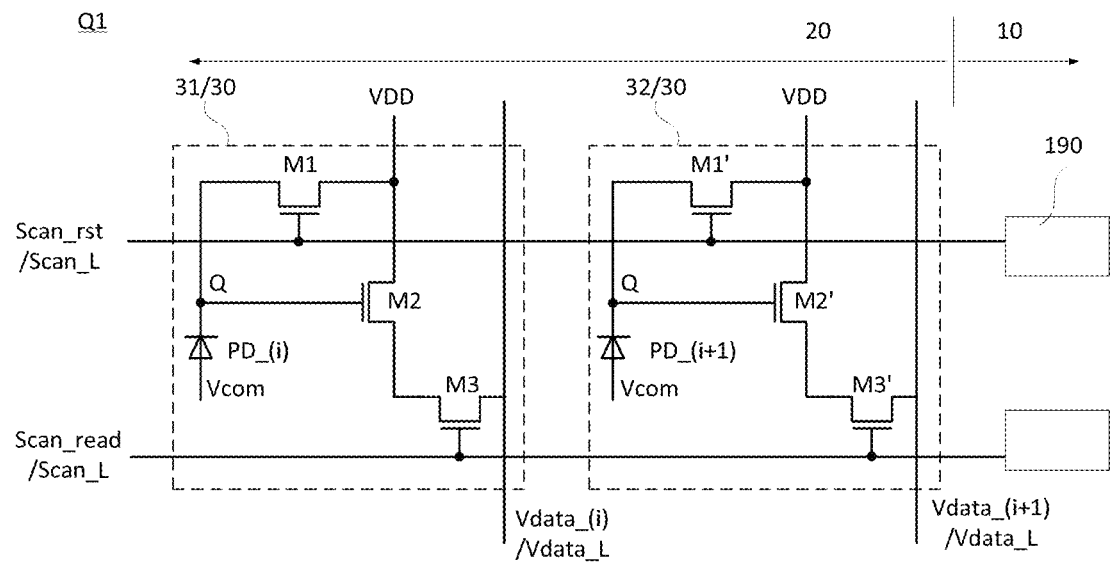
FIG. 2 illustrates a portion of a sensor circuit in a Q1 region in FIG. 1 consistent with various disclosed embodiments in the present disclosure.

The present disclosure provides a display panel. As shown in FIG. 1 and FIG. 2, in one embodiment, the display panel may include a display region 20 and a non-display region 10. At least a portion of the non-display region 10 may surround the display region 20. The display region 20 may include a plurality of sensor circuits 30. Each of the plurality of sensor circuits 30 may include at least one transistor. Transistors in at least two sensor circuits 30 of the plurality of sensor circuits 30 may be different types.

For description purposes only, the embodiment in FIG. 2 where each sensor circuit 30 includes three transistors is used as an example to illustrate the present disclosure, and does not limit the scope of the present disclosure. In real applications of various embodiments of the present disclosure, any suitable sensor circuits with other numbers of transistors may be adopted.

In one embodiment of the present disclosure, to increase the screen-to-body ratio of the display panel, optical collection elements (such as cameras, fingerprint recognition sensors, or other devices that use optical signals) may be disposed in positions that overlap with the display region. Further, corresponding sensor circuits may be integrated into the display panel. The display panel may usually include a substrate and a thin film transistor array layer located on one side of the substrate. Therefore, integrating the sensor circuits into the thin film transistor array layer of the display panel and using the thin film transistor array layer to simultaneously fabricate the sensor circuits may achieve a thinner and lighter display device and improve user experience. Correspondingly, the sensor circuits may be disposed in a local region of the display panel, or may be disposed on the entire surface. The sensor circuits in the present disclosure may include sensors required for fingerprint recognition or under-screen photography. The embodiments with the fingerprint recognition sensor circuit will be used as examples to illustrate the present disclosure.

One transistor may be a thin film transistor, a field effect transistor, or another device with the same characteristics. The embodiments with a thin film transistor will be used as examples for description. Depending on the material of active layers, thin film transistors may be roughly divided into amorphous silicon thin film transistors with active layers made of amorphous silicon, polycrystalline silicon thin film transistors with active layers made of polycrystalline silicon, and oxide semiconductor thin film transistors with oxide semiconductor active layers. Amorphous silicon thin film transistors (a-Si TFTs) have the advantages of short manufacturing time and low manufacturing cost. Polycrystalline silicon thin film transistors (poly-Si TFTs) have the advantages of high electron mobility and good stability, enabling thinness, high resolution, and high power efficiency. A polysilicon thin film transistor may include a low temperature polysilicon (LTPS) thin film transistor or a polysilicon thin film transistor. A polycrystalline thin film silicon transistor has the advantages of high electron mobility and fast driving. Oxide semiconductor thin film transistors (oxide semiconductor TFTs) have high mobility and large resistance changes depending on oxygen content. Therefore, the amount of leakage current generated in the off state of the oxide semiconductor thin film transistors is smaller than the amount of leakage current generated in the off state of the polysilicon thin film transistors. Exemplarily, the oxide semiconductor may include at least one of indium gallium zinc oxide (IGZO), indium gallium tin oxide (IGTO), or indium zinc tin oxide (IZTO).

A channel type of one thin film transistor may be N-type or P-type. When the channel type of the thin film transistor is N-type, the thin film transistor may be turned on under the control of a high-level control signal and turned off under the control of a low-level control signal. When the channel type of the thin-film transistor is P-type, the thin film transistor may be turned on under the control of a low-level control signal and turned off under the control of a high-level control signal.

In one embodiment, different types of transistors may refer to different materials of active layers and/or different channel types of the transistors. That is, when the materials of active layers of two transistors are different, the two transistors may be considered to be of different types. When the channel types of two transistors are different, the two transistors may be considered to be of different types. When the materials of active layers of the two transistors are different and the channel types are also different, the two transistors may also be considered to be of different types. Taking the active layer of a transistor as a polysilicon material or a metal oxide material as an example, when any of the following conditions is met, the two transistors may be considered to be of different types: 1. the active layer of one transistor is made of polysilicon material, and the active layer of the other transistor is made of metal oxide, and the channel types of the two transistors may be the same or different; 2. the active layers of the two transistors are both made of polysilicon material, one channel type is P-type, and the other channel type is N-type; 3. the active layers of both transistors are metal oxide, one channel type is P-type, and the other channel type is N-type.

In one embodiment shown in FIG. 2 which shows a portion of sensor circuits in the Q1 region of FIG. 1, the active layers of the transistors may be made of different types of materials. As shown in FIG. 1 and FIG. 2, the display region 20 may include a plurality of sensor circuits 30. For example, the plurality of sensor circuits 30 may include a first circuit sensor 31 and a second sensor circuit 32. The first sensor circuit 31 may include a transistor M1, a transistor M2, and a transistor M3. The second sensor circuit 32 may include a transistor M1', a transistor M2', and a transistor M3'. In one embodiment shown in FIG. 2, the transistor M1, the transistor M2, and the transistor M3 may be a same type (including a same material of active layers), while the transistor M1', the transistor M2', and the transistor M3' may be another type (including another same material of active layers).

By arranging the sensor circuits integrated within the display panel to contain different types of transistors, that is, by setting the transistors in the two sensor circuits to have different active layer materials and/or different channel types, the space occupied by the sensor circuits in the display region may be reduced, thereby increasing the number and density of sensors, and improving the recognition efficiency and accuracy of sensors.

In some other embodiments, as shown in FIG. 2, the plurality of sensor circuits 30 may include a first sensor circuit 31 and a second sensor circuit 32. At least one transistor in the first sensor circuit 31 may be a first-type thin film transistor, and at least one transistor in the second sensor circuit 32 may be a second-type thin film transistor. The first-type thin film transistor may include an active layer located in the oxide semiconductor layer. The second-type thin film transistor may include an active layer located in the silicon semiconductor layer.

The embodiment where the oxide semiconductor includes IGZO is used as an example only to illustrate the present disclosure, and does not limit the scope of the present disclosure. The silicon semiconductor layer may be made of a material including amorphous silicon, polycrystalline silicon, or low-temperature polysilicon. The embodiment where the silicon semiconductor layer includes low-temperature polysilicon is used as an example only to illustrate the present disclosure, and does not limit the scope of the present disclosure.

In one embodiment, as shown in FIG. 2, transistors in the first sensor circuit 31 may be N-type low-temperature polysilicon thin film transistors (i.e., LTPS-NTFTs), and transistors in the second sensor circuit 32 may be N-type oxide semiconductor thin film transistors (i.e., IGZO-NTFTs). This embodiment with the N-type low-temperature polysilicon thin film transistors and the N-type oxide semiconductor thin film transistors as two different type of transistor is used as an example only to illustrate the present disclosure, and does not limit the scope of the present disclosure.

As shown in FIG. 2, the plurality of sensor circuit 30 may include the first sensor circuit 31 and the second sensor circuit 32. The transistor M1, the transistor M2 and the transistor M3 in the first sensor circuit 31 may all be first-type thin film transistors, that is, IGZO-NTFTs. The transistor M1', the transistor M2' and the transistor M3' in the second sensor circuit 32 may all be second-type thin film transistors, that is, LTPS-NTFTs. It can be understood that, in some other embodiments, one or two of the transistors M1, M2 and M3 may also be other types of transistors, such as LTPS-NTFTs, one or two of the transistors M1', M2', and M3' may also be other types of transistors such as IGZO-NTFTs.

As shown in FIG. 2 which is a schematic structural diagram of the first sensor circuit 31 and the second sensor circuit 32, the display panel may include a plurality of scan lines Scan_L (such as a reset control signal line Scan_rst and a read control signal line Scan_read), a plurality of identification data lines Vdata_L (such as an identification data line Vdata_(i) and an identification data line Vdata_(i+1)), a first power supply voltage signal line VDD, and a second power supply voltage signal line Vcom. The first sensor circuit 31 may include a photosensitive diode PD_(i) and a plurality of transistors (M1~M3). A first electrode of the photodiode PD_(i) may be electrically connected to the second power supply voltage signal line Vcom, and a second electrode of the photodiode PD_(i) may be electrically connected to a first electrode of the transistor M1 and a gate of the transistor M2. A second electrode of the transistor M1 may be electrically connected to a first electrode of the transistor M2 and the first power supply voltage signal line VDD, and a gate of the transistor M1 may be electrically connected to the reset control signal line Scan_rst. A second electrode of the transistor M2 may be electrically connected to a first electrode of the transistor M3, and a second electrode of the transistor M3 may be electrically connected to the identification data line Vdata_(i). A gate of the transistor M3 may be electrically connected to the read control signal line Scan_read. The second sensor circuit 32 may include a photodiode PD_(i+1) and a plurality of transistors (M1'~M3'). A first electrode of the photodiode PD_(i+1) may be electrically connected to the second power supply voltage signal line Vcom, and a second electrode of the photodiode PD_(i+1) may be electrically connected to a first electrode of the transistor M1' and a gate of the transistor M2'. A second electrode of the transistor M1' may be electrically connected to a first electrode of the transistor M2' and the first power signal line VDD. A gate electrode of the transistor M1' may be electrically connected to the reset control signal line Scan_rst. A second electrode of the transistor M2' may be electrically connected to the first electrode of the transistor M3', and a second electrode of the transistor M3' may be electrically connected to the identification data line Vdata_(i+1). A gate of the transistor M3' may be electrically connected to the read control signal line Scan_read.

Figure 3:
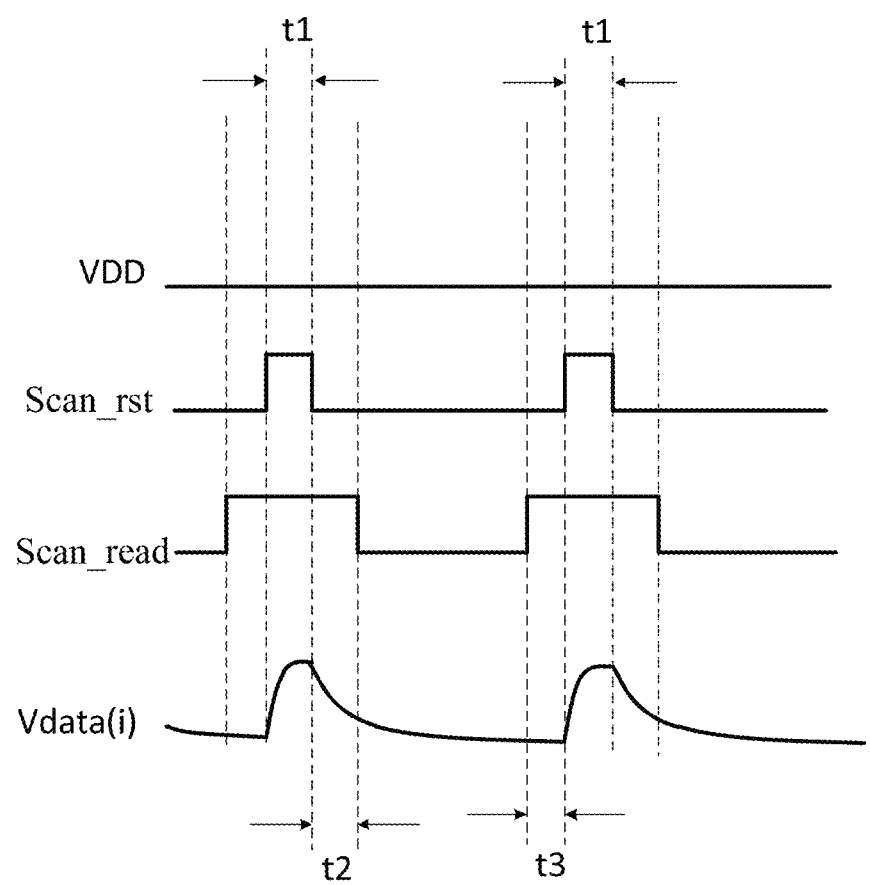
FIG. 3 illustrates a working timing diagram of FIG. 2 consistent with various disclosed embodiments in the present disclosure.

As shown in FIG. 3 which is a timing diagram corresponding to FIG. 2, the first sensor circuit 31 and the second sensor circuit 32 may have similar working processes and the first sensor circuit 31 will be used as an example for illustration. The working process may include a reset stage t1 and an exposure stage. The exposure stage may include a first reading stage t2 and a second reading stage t3.

As shown in FIG. 2 and FIG. 3, during the reset period t1, a high voltage level provided by the reset control signal line Scan_rst may control the transistor M1 to be turned on, and the voltage on the first power supply voltage signal line VDD may be transmitted to the Q node through the transistor M1, causing the potential of the Q node to be reset. At this time, the potential of the Q node may be higher than the voltage signal provided by the second power supply voltage signal line Vcom. When the photodiode PD_(i) is not exposed to light, the photodiode PD_(i) may be in a reverse-biased cut-off state.

During the first reading period t2, the low voltage level provided by the reset control signal line Scan_rst may control the transistor M1 to be turned off, and the high voltage level provided by the read control signal line Scan_read may control the transistor M3 to be turned on. Under illumination, the photosensitive diode PD_(i) may generate a leakage current flowing from the Q node to the second power supply voltage signal line Vcom, causing the potential at the Q node to decrease. The transistor M2 may generate a leakage current under the control of the Q node and transmit the leakage current to the identification data line Vdata_(i) through the transistor M3, and the identification data line Vdata_(i) may output the voltage value V1.

As the exposure time increases, the potential at the Q node may keep decreasing.

During the second read period t3, the low voltage level provided by the reset control signal line Scan_rst may control the transistor M1 to be turned off, and the high voltage level provided by the read control signal line Scan_read may control the transistor M3 to be turned on. The transistor M2 may generate a leakage current under the control of the Q node and transmit the leakage current to the identification data line Vdata_(i) through the transistor M3, and the identification data line Vdata_(i) may output the voltage value V2.

During fingerprint detection, different fingerprint regions may reflect different light intensities to the photodiode PD_(i), and the light intensity may determine the leakage current of the photodiode PD_(i). The leakage current of the photodiode PD_(i) may determine the potential of the Q node, and the potential of the Q node may determine the output voltage value of the identification data line Vdata_(i). Therefore, the above values of V1-V2 may reflect the intensity of light received by the photodiode PD_(i). That is, fingerprint recognition may be achieved by detecting the corresponding V1-V2 values obtained at different positions in the fingerprint recognition region.

In the embodiment shown in FIG. 2, both one first-type thin film transistor and one second-type thin film transistor may include the active layers. The active layer of the first-type thin film transistor may be an oxide semiconductor layer, and the active layer of the second-type thin film transistor may be a silicon semiconductor layer. The different types of transistors may include first-type thin film transistors and second-type thin film transistors. The first sensor circuit 31 including the first-type thin film transistors and the second sensor circuit 32 including the second-type thin film transistors may be arranged in a same row in the display panel, such that at least part of the signal lines may be shared, to reduce the space occupied by the lines on the display panel, thereby increasing the number and density of sensors and improving the recognition efficiency and accuracy of the sensors. Further, the plurality of sensor circuits 30 may be provided in the entire display panel to realize full-screen recognition functions, such as full-screen fingerprint recognition.

Figure 4:
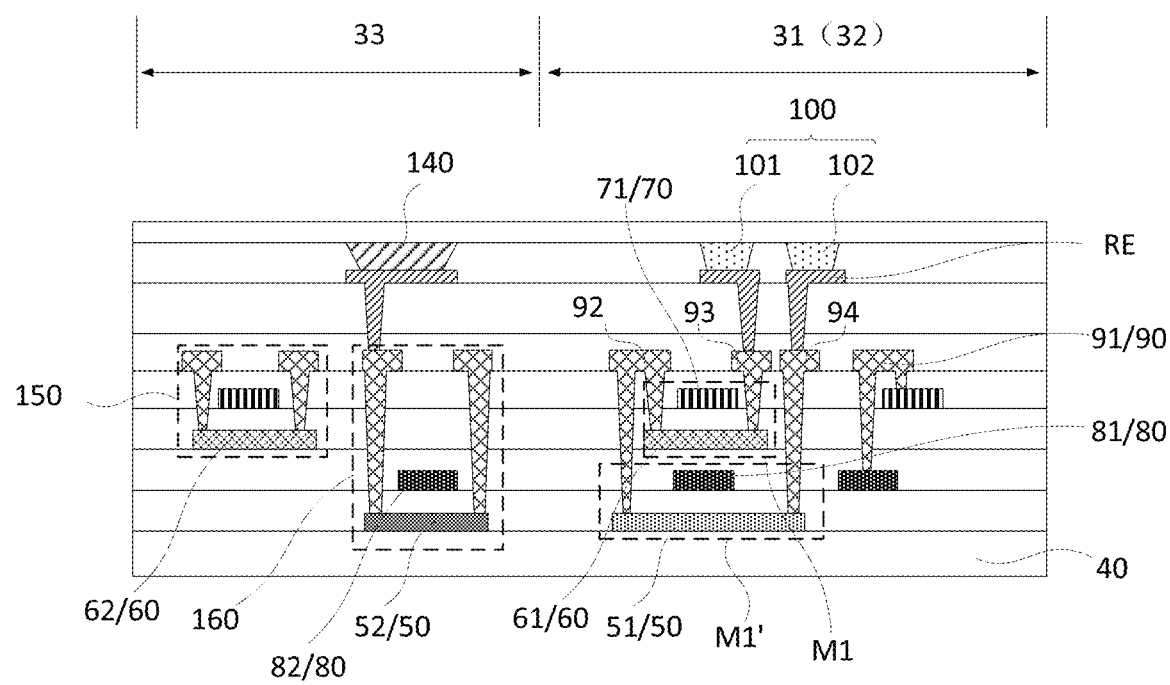
FIG. 4 illustrates a partial cross-sectional view of a display region in an exemplary display panel consistent with various disclosed embodiments in the present disclosure.

In some embodiments shown in FIG. 4 which is a cross-sectional view of a portion of a display region of a display panel, the plurality of sensor circuits 30 may be disposed on a substrate 40. The first sensor circuit 31 and the second sensor circuit 32 may at least partially overlap with each other along a direction perpendicular to a plane where the substrate 40 is located.

As shown in FIG. 4, the plurality of sensor circuits 30 may be disposed on the substrate 40. The first sensor circuit 31 and the second sensor circuit 32 may be stacked along the direction perpendicular to the plane where the substrate 40 is located. When viewing the first sensor circuit 31 and the second sensor circuit 32 from a perspective perpendicular to the plane where the substrate 40 is located, the structures of the first sensor circuit 31 and the second sensor circuit 32 may be at least partially overlapping.

FIG. 2 only shows the structures of the first sensor circuit 31 and the second sensor circuit 32, and the at least partial overlap between the first sensor circuit 31 and the second sensor circuit 32 is not shown in FIG. 2.

In one embodiment as shown in FIG. 2 and FIG. 3, projections of the transistors M1 to M3 in the first sensor circuit 31 and the same number of transistors M1' to M3' in the second sensor circuit 32 on the substrate 40 in the direction perpendicular to the plane of the substrate 40 may have a one-to-one correspondence. The transistor M1 in the first sensor circuit 31 may be a first-type thin film transistor, and the transistor M1' in the second sensor circuit 32 may be a second-type thin film transistor. FIG. 4 shows the transistor M1 and the transistor M1' in FIG. 2, and the projection of the transistor M1 and the projection of the transistor M1' on the substrate 40 may correspond to each other and at least partially overlap each other. The active layer 51 of the transistor M1 may be located in the oxide semiconductor layer 60, and the active layer 51 of the transistor M1' may be located in the silicon semiconductor layer 50. The first gate 70 of the transistor M1 may be located on the first gate layer 70, and the second gate 80 of the transistor M1' may be located on the second gate layer 80. As shown in FIG. 4 and FIG. 2, different transistors may have different active layer materials. The transistor M1 may include the oxide semiconductor layer 60 and the transistor M1' may have the silicon semiconductor layer 50. The transistors M2, M3, M2' and M3' are not shown in FIG. 4, but their arrangement is similar to the transistors M1 and M1'. The projections of the transistor M2 and the transistor M2' in FIG. 2 on the substrate may correspond to each other and at least partially overlap each other. The projections of the transistor M3 and the transistor M3' in FIG. 2 on the substrate may correspond to each other and at least partially overlap each other.

It should be noted that FIG. 4 only illustrates some film layers of the display panel. During the actual production process, at least one other film layer may be further disposed between adjacent film layers. The present disclosure has no limit on this.

By arranging the first sensor circuit 31 and the second sensor circuit 32 in a same row in the display panel, the first sensor circuit 31 and the second sensor circuit 32 may share at least a portion of signal lines in a same row (such as the reset control signal line Scan_rst and the reading control signal line Scan_read), to reduce the space occupied by the lines in the display panel. Also, the plurality of sensor circuits 30 sharing the signal lines in the same row may have consistent control signals, improving the number and density of the sensors, and also the recognition efficiency and accuracy of the sensors may be improved.

In some embodiments shown in FIG. 4, along the direction perpendicular to the plane of the substrate 40, the oxide semiconductor layer 60 in the first-type thin film transistor may have a first projection, and the silicon semiconductor layer of the second-type thin film transistor may have a second projection. The first projection may at least partially overlap with the second projection.

For example, as shown in FIG. 4, the transistor M1 in the first sensor circuit 31 may be a first-type thin film transistor. The active layer of the first-type thin film transistor may be one oxide semiconductor layer 60. The oxide semiconductor layer 60 may have the first projection in the direction perpendicular to the plane where the substrate 40 is located. The transistor M1' in the second sensor circuit 32 may be one second-type thin film transistor. The active layer of the second-type thin film transistor may be one silicon semiconductor layer 50. The silicon semiconductor layer 50 may have the second projection in the direction perpendicular to the plane where the substrate 40 is located. The first projection and the second projection may be at least partially overlapping. Since the projection of the active layer of the first-type thin film transistor in the first sensor circuit 31 and the projection of the active layer of the second-type thin film transistor in the second sensor circuit 32 are at least partially overlapping, the space proportions occupied by the different types of transistors in the display region may be reduced and the number and density of sensors may be increased.

In some embodiments shown in FIG. 4, along the direction perpendicular to the plane where the substrate 40 is located, the first gate 71 of the first-type thin film transistor may have a third projection, and the third projection may at least partially overlap with the first projection.

As shown in FIG. 4, the transistor M1 in the first sensor circuit 31 may be a first-type thin film transistor. The active layer of the first-type thin film transistor may be one oxide semiconductor layer 60. The oxide semiconductor layer 60 may have the first projection in the direction perpendicular to the plane where the substrate 40 is located. The first-type thin film transistor may have the first gate 71. Along the direction perpendicular to the plane where the substrate 40 is located, the first gate 71 of the first-type thin film transistor may have the third projection. And the third projection may at least partially overlap with the first projection. In one embodiment, the third projection of the first gate 71 may be located within the first projection of the oxide semiconductor layer 60, to greatly reduce the area occupied by the first-type thin film transistor in the display panel.

In some embodiments shown in FIG. 4, along the direction perpendicular to the plane where the substrate 40 is located, the second gate 81 of the second-type thin film transistor may have a fourth projection, and the fourth projection may at least partially overlap with the second projection.

As shown in FIG. 4, the transistor M1' in the second sensor circuit 32 may be a second-type thin film transistor. The active layer 51 of the second-type thin film transistor may be one silicon semiconductor layer 50. The silicon semiconductor layer 50 may have the second projection in the direction perpendicular to the plane where the substrate 40 is located. The second-type thin film transistor may have the second gate 81. Along the direction perpendicular to the plane where the substrate 40 is located, the second gate 81 of the second-type thin film transistor may have the fourth projection. And the fourth projection may at least partially overlap with the second projection. In one embodiment, the fourth projection of the second gate 81 may be located within the second projection of the silicon semiconductor layer 50, to greatly reduce the area occupied by the second-type thin film transistor in the display panel.

In some embodiments shown in FIG. 4, along the direction perpendicular to the plane where the substrate 40 is located, the first gate 71 of the first-type thin film transistor may have a third projection, and the second gate 81 of the second-type thin film transistor may have a fourth projection. The fourth projection may at least partially overlap with the third projection.

For example, as shown in FIG. 4, the first sensor circuit 31 and the second sensor circuit 32 may include two different types of transistors, that is, the first-type thin film transistors and the second-type thin film transistors. The transistor M1 in the first sensor circuit 31 may be a first-type thin film transistor, and the transistor M1' in the second sensor circuit 32 may be a second-type thin film transistor. The gate of the transistor M1 and the gate of the transistor M1' may be located in different film layers. The projection of the first gate 71 and the projection of the second gate 81 along the direction perpendicular to the plane where the substrate 40 is located may be at least partially overlapping. In one embodiment, the third projection of the first gate 71 may be located within the fourth projection of the second gate 81, to greatly reduce the area occupied by the first-type thin film transistor and the second-type thin film transistor in the display panel. The number and density of the sensors may be increased, and the recognition efficiency and accuracy of the sensors may be improved.

As shown in FIG. 4, in one embodiment, the first-type thin film transistor may have a top-bottom dual-gate structure. A top gate may be the first gate 71, and the first gate 71 and the second gate 81 may be used as the top gate and bottom gate of the first-type thin film transistor. The second gate 81 may be located on a side of the oxide semiconductor layer 60 away from the first gate 71. The projection of the first gate 71 and the projection of the second gate 81 along the direction perpendicular to the plane where the substrate 40 is located may be at least partially overlapping, to greatly reduce the area occupied by the first-type thin film transistor in the display panel. Further, the second gate 80 may be shared by the first-type thin film transistor and the second-type thin film transistor. In one embodiment, as shown in FIG. 4, the first gate 71 and the second gate 81 may be electrically connected for receiving same signals.

In some embodiments shown in FIG. 2, the display region 20 may further include a plurality of scan lines Scan_L, and the non-display region 10 may include a plurality of shift registers 190. At least two sensor circuits 30 of the plurality of sensor circuits 30 may be electrically connected to one same shift register 90 of the plurality of shift registers 90 through one same scan line Scan_L.

As shown in FIG. 3, the display region 20 may include the plurality of scan lines Scan_L, and at least two sensor circuits 30 in the display region 20 may be connected to one same scan line Scan_L, such as the reset control signal line Scan_rst or the reading control signal line Scan_read. The non-display region 10 may include the plurality of shift registers 190. At least two sensor circuits 30 of the plurality of sensor circuits 30 may be electrically connected to one same shift register 90 of the plurality of shift registers 90. When one shift register 190 sends out the control instruction, at least two sensor circuits 30 may be turned on or off at the same time, achieving co-gate driving of at least two sensor circuits 30. The wiring space between different sensors may be reduced, thereby improving the recognition efficiency and accuracy of the sensors.

In some embodiments, the display region of the display panel may also include a transfer layer 90. In one embodiment, the transfer layer 90 shown in FIG. 4 may at least include a first transfer structure 91. The transistor M1 in the first sensor circuit 31 may be a first-type thin film transistor, and the transistor M1' in the second sensor circuit 32 may be a second-type thin film transistor. The first gate 71 of the transistor M1 and the second gate 81 of the transistor M1' may be located respectively in different layers. The transfer layer 90 may be located on a side of the first gate 71 and the second gate 81 away from the substrate 40. The transfer layer 90 may include the first transfer structure 91. The first transfer structure 91 may be electrically connected to one corresponding scan line, the first gate 71 and the second gate 81. It can be understood that the scan line may be located in at least one of the first gate layer 70 and the second gate layer 80. Of course, in some other embodiments, a capacitive metal layer may also be provided between the second gate layer 80 and the oxide semiconductor layer 60, and the scan line may also be at least partially located in the capacitive metal layer. The first gate 71 may be located in the first gate layer 70, and the second gate 81 may be located in the second gate layer 80.

In the above embodiments, as shown in FIG. 4, the transfer layer 90 may be used to realize the connection with the corresponding scan line. The transfer layer 90 may include the first transfer structure 91, and the first transfer structure 91 may electrically connect the first gate 70, the second gate 80 and the corresponding scan line. The first transfer structure 90 may also be used to set other signal lines, such as data lines, first power supply voltage signal lines and second power supply voltage signal lines, which will not be described in detail here.

In some embodiments, as shown in FIG. 4, the transfer layer 90 may also include a second transfer structure 92, a third transfer structure 93 and a fourth transfer structure 94. The second transfer structure 92 and the third transfer structure 93 may be respectively connected to the first photosensitive device 101, and the fourth transfer structure 94 may be connected to the second photosensitive device 102. The first electrode of the first-type thin film transistor and the first electrode of the second-type thin film transistor may be respectively connected to the second transfer structure 92. The second electrode of the first-type thin film transistor may be connected to the third transfer structure 93, and the second electrode of the second-type thin film transistor may be connected to the fourth transfer structure 94.

In one embodiment shown in FIG. 4, the first electrode of the first-type thin film transistor may be a source electrode, and the second electrode may be a drain electrode. The first electrode of the second-type thin film transistor may be a source electrode, and the second electrode may be a drain electrode. In some other embodiments, the source and drain electrodes may be interchanged. The second transfer structure 92 may be connected to the source electrode of the first-type thin film transistor and the source electrode of the second-type thin film transistor, and the third transfer structure 93 may be connected to the drain electrode of the first-type thin film transistor and the first photosensitive device 101 respectively. The fourth transfer structure 94 may be respectively connected to the drain electrode of the second-type thin film transistor and the second photosensitive device 102. The above-mentioned second transfer structure 92, third transfer structure 93 and fourth transfer structure 94 may also be used as padding layers of the display panel, to provide electrothermal performance to the display panel for heat dissipation and protection of circuit components. The third transfer structure 93 may serve as one of the padding layers to connect the first photosensitive device 101 and the oxide semiconductor layer 60. The fourth transfer structure 94 may serve as one of the padding layers to connect the second photosensitive device 102 and the oxide semiconductor layer 60. The first photosensitive device 101 and the second photosensitive device 102 may also include electrodes located on the first electrode layer RE.

In one embodiment shown in FIG. 4, the display panel may include a plurality of photosensitive devices 100, a plurality of thin film transistors and a plurality of light-emitting devices 140 located on the same side of the substrate 40. The display region may also include display pixel circuits 33. One display pixel circuit 33 may include at least one light-emitting device 140 of the plurality of light-emitting devices 140 and at least one thin film transistor.

Each of the first sensor circuit 31 and the second sensor circuit 32 may respectively include a photosensitive device 100 and a plurality of thin film transistors.

In one embodiment, as shown in FIG. 4, in the structure of the display panel, the display panel may include the plurality of photosensitive devices 100, the plurality of thin film transistors and the plurality of light-emitting devices 140 located on the same side of the substrate 40. One display pixel circuit 33 in the display region may include one light-emitting device 140 and at least one transistor. The first sensor circuit 31 in the display region may include one photosensitive device 101 and a transistor M1, and the second sensor circuit 32 in the display region may include one photosensitive device 102 and a transistor. M1'.

In some embodiments, as shown in FIG. 4, the display pixel circuit 33 may include a fifth transistor 150. The transistors in the first sensor circuit 31 may all be first-type thin film transistors. A gate of the fifth transistor 150 and the gates of the first-type thin film transistors may be located in one same layer, and the active layer of the fifth transistor 150 and the active layers of the first-type thin film transistors may be located in the oxide semiconductor layer 60.

In the above embodiments, as shown in FIG. 4, the fifth transistor 150 in the display pixel circuit 33 and the transistors in the first sensor circuit 31 may all be first-type thin film transistors. That is, the active layer 62 of the fifth transistor 150 and the active layer 61 of the transistor M1 may be both located in the oxide semiconductor layer 60. Further, the gate of the fifth transistor 150 and the gate 71 of the transistor M1 may be located on the same layer.

In some other embodiments, as shown in FIG. 4, the display pixel circuit 33 may also include a sixth transistor 160, and the transistors in the second sensor circuit 32 may all be second-type thin film transistors. The gate of the sixth transistor 160 and the gates of the second-type thin film transistors may be located on the same layer, and the active layer of the sixth transistor 160 and the active layers of the second-type thin film transistors may be located in the silicon semiconductor layer 50.

In the above embodiments, as shown in FIG. 4, the sixth transistor 160 in the display pixel circuit 33 and the transistors in the second sensor circuit 32 may all be second-type thin film transistors. That is, the active layer 52 of the sixth transistor 160 and the active layer 51 of the transistor M1' may be both located in the silicon semiconductor layer 50. Further, the gate of the sixth transistor 160 and the gate 81 of the transistor M1' may be located on the same layer.

Figure 5:
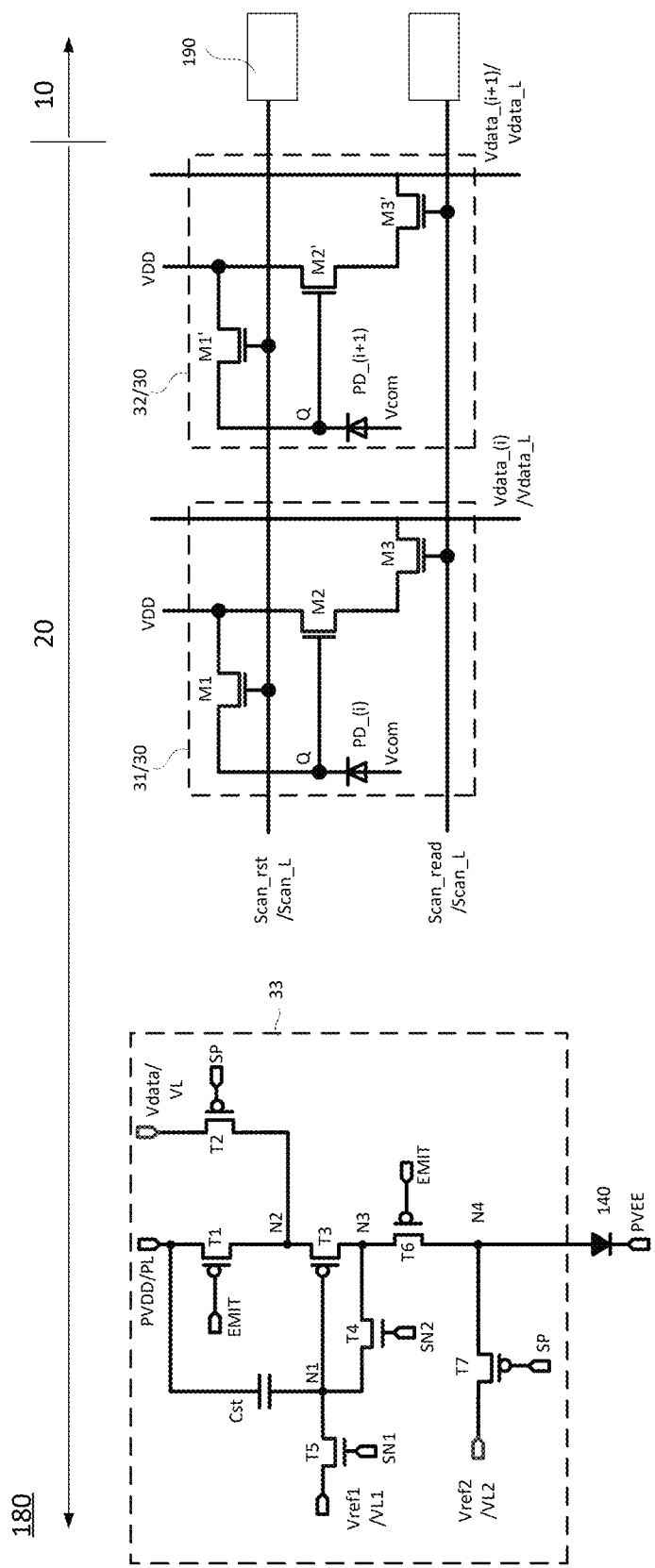
FIG. 5 illustrates a partial structure of sensor circuits in a display region of an exemplary display panel consistent with various disclosed embodiments in the present disclosure.

In some embodiments, as shown in FIG. 5, the display region may include a plurality of driving circuit units. At least one driving circuit unit of the plurality of driving circuit units may include one display pixel circuit 33 and two sensor circuits 30. The sensor circuits 30 in this at least one driving circuit unit may be connected to one same shift register 190 through one same scan line.

As shown in FIG. 5 which is a partial structure of two driving circuit units 180 in the display region 20 and two shift registers 190 in the non-display region 10, one driving circuit unit 180 may include at least one display pixel circuit 33 and two sensor circuits 30. The display pixel circuit 33 may include a first light-emitting control transistor T1, a data writing transistor T2, a driving transistor T3, a threshold compensation transistor T4, an initialization transistor T5, a second light-emitting control transistor T6, a reset transistor T7, a storage capacitor Cst and a light-emitting device 140. The scanning signal line SN1 may control the on or off of the initialization transistor T5, and may reset the gate potential of the driving transistor T3 when the initialization transistor T5 is turned on. That is, the initialization signal Vref1 of the initialization signal line VL1 may be transmitted to the initialization transistor T5, to reset the connection node (the first node N1) of the driving transistor T3, the initialization transistor T5, the threshold compensation transistor T4 and the storage capacitor Cst. The connection point of the first light-emitting control transistor T1 and the driving transistor T3 may be the second node N2. The connection point of the driving transistor T3 and the second light-emitting control transistor T6 may be the third node N3. The connection point of the second light-emitting control transistor T6, the reset transistor T7 and the light-emitting device 140 may be the fourth node N4. The scanning signal line SP may control the on and off of the data writing transistor T2, and write the data signal Vdata on the data signal line VL to the gate of the driving transistor T3 when the data writing transistor T2 is turned on. The scanning signal line SN2 may control the turning on and off of the threshold compensation transistor T4, and compensate the threshold voltage of the driving transistor T3 when the threshold compensation transistor T4 is turned on. At the same time, the scanning signal line SP may control the on and off of the reset transistor T7, and reset the anode of the light-emitting device 140 when the reset transistor T7 is turned on. That is, the reset signal Vref2 of the reset signal line VL2 may be transmitted to the anode of the light-emitting device 140. The light-emitting control signal line EMIT may control the on and off of the first light-emitting control transistor T1 and the second light-emitting control transistor T6, and the power signal PVDD transmitted on the power supply signal line PL when controlling the first light-emitting control transistor T1 and the second light-emitting control transistor T6 to be turned may be transmitted to the light-emitting device 140, and the light-emitting device 140 may receive the public power signal PVEE at the same time, thereby realizing the display and light-emitting of the light-emitting device 140. It can be understood that the initialization signal line VL1 and the reset signal line VL2 may be electrically connected, to transmit the same voltage signal. The transistor M1 in the first sensor circuit 31 and the transistor M1' in the second sensor circuit 32 in the sensor circuit 30 may be connected to the same shift register 190 through the reset control signal line Scan_rst. The transistor M3 in the first sensor circuit 31 and the transistor M3' in the second sensor circuit 32 may be connected to the same shift register 190 through the read control signal line Scan_read. When the shift register 190 issues a control instruction, at least two sensor circuits 30 may be turned on or off at the same time, to achieve co-gate driving of the at least two sensor circuits 30. Since the reset control signal line Scan_rst and the read control signal line Scan_read are shared, the space occupied by the wiring on the display panel may be reduced, the wiring space may be reduced, and the design resolution of the fingerprint recognition image may be improved. For the transistor M2, the transistor M2', the second power supply voltage signal line Vcom and the Q node, the reference may be made to the relevant descriptions of FIG. 2 and FIG. 3.

The initialization transistor T5 and the threshold compensation transistor T4 may be the first-type thin film transistors, such as IGZO-NTFTs. Remaining transistors may be third type thin film transistors, such as P-type low-temperature polysilicon thin film transistors, such as LTPS-PTFT.

Figure 6:
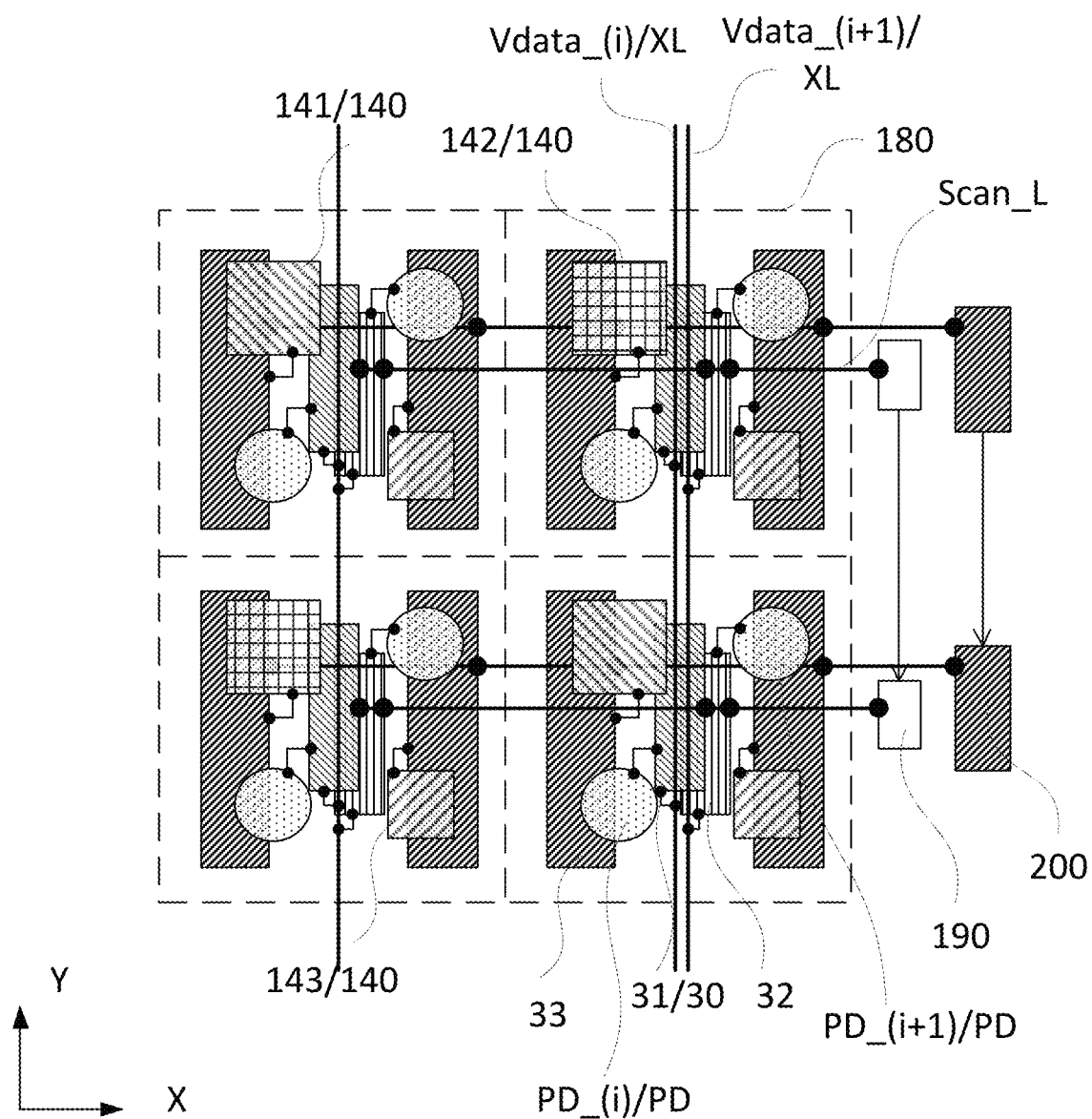
FIG. 6 illustrates a partially top view of an array arrangement in a display region of an exemplary display panel consistent with various disclosed embodiments in the present disclosure.

In some embodiments as shown in FIG. 2, FIG. 5 and FIG. 6, the plurality of driving circuit units 180 may be arranged in an array, and driving circuit units 180 of the plurality of driving circuit units 180 in a same row may be electrically connected to one same scan line.

As shown in FIG. 6, the light-emitting devices 140 may include a first light-emitting device 141, a second light-emitting device 142 and a third light-emitting device 143 that emit different colors. The first light-emitting device 141, the second light-emitting device 142, and the third light-emitting device 143 may be arranged in rows and columns along the first direction X and the second direction Y. The photodiodes PD may be arranged in rows and columns along the first direction X and the second direction Y. As shown in FIG. 6, one driving circuit unit 180 including two display pixel circuits 33 and two sensor circuits 30 is used as an example for illustration. Taking the photosensitive diode PD_(i) and the photosensitive diode PD_(i+1) as an example, the photosensitive diode PD_(i) may be electrically connected to the first sensor circuit 31, and the photosensitive diode PD_(i+1) may be electrically connected to the second sensor circuit 32. The first sensor circuit 31 and the second sensor circuit 32 may be located in the same drive circuit unit 180 and electrically connected to the same scan line Scan_L. The plurality of first sensor circuits 31 and the second sensor circuits 32 of the plurality of driving circuit units 180 located in the same row may be electrically connected to the same scan line Scan_L. With this design, the sensor circuits 30 in the same row may share the same scan line, thereby reducing the number of wirings on the display panel and reducing the space occupied by the wiring on the display panel. Therefore, the number and density of sensors may be increased, and recognition efficiency and recognition accuracy of the sensors may be improved.

For description purposes only, the embodiment in FIG. 6 only showing one shift register 190 and one scan line Scan_L electrically connected to the sensor circuits 30 is used as an example to illustrate the present disclosure, and does not limit the present disclosure. In some other embodiments, the sensor circuits may need to be controlled by multiple scan lines to work. Accordingly, the shift register 190 may include multiple sub-shift registers, and transistors that play the same role in multiple sensors may be electrically connected to the same sub-shift register through the same scan line, to achieve normal operation of the sensor.

For description purposes only, the embodiment in FIG. 6 only showing 2 rows and 2 columns of driving circuit units 180 is used as an example to illustrate the present disclosure, and does not limit the present disclosure. In some other embodiments, the display panel may actually include M rows and N columns of driving circuit units 180, where M≥2 and N≥2. One driving circuit unit 180 may include other numbers of display pixel circuits 33 and sensor circuits 30. Furthermore, in some embodiments, at least one driving circuit unit 180 may not be configured with the sensor circuits 30, or may be configured with three or more sensor circuits 30. Also, the arrangement of the first light-emitting device 141, the second light-emitting device 142 and the third light-emitting device 143 may be selected according to actual needs. In one embodiment, the first light-emitting device 141 may be a blue light-emitting device, the second light-emitting device 142 may be a red light-emitting device, and the third light-emitting device 143 may be a green light-emitting device. Also, the embodiment where the first sensor circuit 31 and the second sensor circuit 32 are at least partially overlapped is used as an example for description. In some other embodiments, the first sensor circuit 31 and the second sensor circuit 32 may be completely overlapped.

As shown in FIG. 5, when one display pixel circuit 33 operates normally, at least three scan shift registers may be needed to provide different signals to the scan signal line SN, the scan signal line SN2 and the scan signal line SP respectively, and at least one light-emitting control shift register may be required to provide a signal to the light-emitting control signal line EMIT. To simplify the details, the embodiment shown in FIG. 6 which only illustrates that one row of display pixel circuits corresponds to one display shift register 200 is used as an example to illustrate the present disclosure, and does not limit the present disclosure. In actual products, the display shift registers 200 may include multiple scanning shift registers and light-emitting control shift registers, thereby realizing normal operation of the display pixel circuits.

In some other embodiments, as shown in FIG. 6, a plurality of driving circuit units 180 may be arranged in an array, and sensor circuits in the multiple driving circuit units 180 in a same column may be electrically connected to a same output signal line XL.

As shown in FIG. 6, among the plurality of driving circuit units 180 located in the same column, the plurality of first sensor circuits 31 may be electrically connected to one same signal line XL (such as the identification data line Vdata_(i)), and the plurality of second sensor circuits 32 may be electrically connected to one same signal line XL (such as the identification data line Vdata_(i+1)). With this design, the sensor circuits 30 in the same column may share the same signal line, thereby reducing the number of wirings on the display panel and reducing the space occupied by the wiring on the display panel. Therefore, the number and density of sensors may be increased, and recognition efficiency and recognition accuracy of the sensors may be improved. It can be understood that the signal lines XL may also include a first power supply voltage signal line and a second power supply voltage signal line.

In some embodiments, as shown in FIG. 2, FIG. 4, and FIG. 6, the projections of at least one transistor in the first sensor circuit 31 and the same number of transistors in the second sensor circuit 32 on the substrate 40 in the direction perpendicular to the plane of the substrate 40 may correspond one to one, and at least partially overlap each other.

The transistors in the first sensor circuit 31 and the transistors in the second sensor circuit 32 may be first-type thin film transistors and second-type thin film transistors respectively. The first sensor circuit 31 may include transistors M1 to M3, and the second sensor Circuit 32 may include transistors M1' to M3'. In the direction perpendicular to the plane of the substrate 40, the projections of at least one transistor in the first sensor circuit 31 and the same number of transistors in the second sensor circuit 32 on the substrate 40 may correspond one to one, and may at least partially overlap each other. This arrangement may be implemented in following manners. (1) The projection of at least one layer of one transistor (such as transistor M1) in the first sensor circuit 31 and the projection of at least one layer of one transistor (such as the transistor M1') in the second sensor circuit 32 on the substrate 40 at least partially overlaps. (2) The projections of two transistors (such as transistors M1 and M2) in the first sensor circuit 31 and two transistors (such as transistors M1' and M2') in the second sensor circuit 32 on the substrate 40 correspond one to one and at least partially overlap, and the projection of at least one layer of each transistor in the first sensor circuit 31 and the projection of at least one layer of one corresponding transistors in the second sensor circuit 32 on the substrate 40 at least partially overlap. (3) The projections of the three transistors (M1~M3) in the first sensor circuit 31 and the three transistors (M1'~M3') in the second sensor circuit 32 on the substrate 40 correspond one-to-one and at least partial overlap, and the projection of at least one layer of each transistor in the first sensor circuit 31 and the projection of at least one layer of one corresponding transistors in the second sensor circuit 32 on the substrate 40 at least partially overlap.

For example, in one embodiment shown in FIG. 4 which illustrates the transistor M1 and the transistor M1' in FIG. 2, the active layer of the transistor M1 and the active layer of the transistor M1' may respectively be an oxide semiconductor layer 60 and a silicon semiconductor layer 50 located at different layers. The oxide semiconductor layer 60 may have a first projection in the direction perpendicular to the plane of the substrate 40. The silicon semiconductor layer 50 may have a second projection in the direction perpendicular to the plane of the substrate 40. The first projection and the second projection may be at least partially overlapping.

In addition to the above-mentioned way that the projections of the active layers in the transistor M1 and the transistor M1' at least partially overlap, in another embodiment, the gate of the transistor M1 and the gate of the transistor M1' may be respectively the first gate 70 and the second gate 80 located on different layers. The first gate 70 may have a third projection along the direction perpendicular to the plane of the substrate 40, and the second grid 80 may have a fourth projection along the direction perpendicular to the plane of the substrate 40. The third projection and the fourth projection may at least partially overlap.

In some embodiments, as shown in FIG. 4, in the direction perpendicular to the plane of the substrate 40, the projections of at least two layers of one transistor in the first sensor circuit 31 on the substrate 40 may at least partially overlap.

For example, as shown in FIG. 4, the transistor M1 in the first sensor circuit 31 may be a first-type thin film transistor. The active layer of the first-type thin film transistor may be an oxide semiconductor layer 60. The transistor M1 may have a first gate 70. Along the direction perpendicular to the plane of the substrate 40, the oxide semiconductor layer 60 may have a first projection in the substrate 40, the first gate 70 may have a third projection, and the first projection and the third projection may at least partially overlap.

In some embodiments, as shown in FIG. 4, in the direction perpendicular to the plane of the substrate 40, the projections of at least two layers of one transistor in the second sensor circuit 32 on the substrate 40 may at least partially overlap.

For example, as shown in FIG. 4, the transistor M1' in the second sensor circuit 32 may be a second-type thin film transistor. The active layer of the second-type thin film transistor may be a silicon semiconductor layer 50. The transistor M1' may have a second gate 80. Along the direction perpendicular to the plane of the substrate 40, the silicon semiconductor layer 70 may have a second projection on the substrate 40, the second gate 80 may have a fourth projection on the substrate 40, and the second projection and the fourth projection may at least partially overlap.

In some other embodiments, as shown in FIG. 4, the transistors in the first sensor circuit 31 and the transistors in the second sensor circuit 32 may be respectively first-type thin film transistors and second-type thin film transistors. The transistor M1 in the first sensor circuit 31 may have a first gate 71, and the transistor M1' in the second sensor circuit 32 may have a second gate 81. In the direction perpendicular to the plane of the substrate 40, the projection of the first gate 71 and the projection of the second gate 81 in the substrate 40 may at least partially overlap. Further, the active layer of the transistor M1 and the active layer of the transistor M1' may be respectively the oxide semiconductor layer 60 and the silicon semiconductor layer 50 located at different layers. In the direction perpendicular to the plane of the substrate 40, the projection of the oxide semiconductor layer 60 and the projection of the silicon semiconductor layer 50 on the substrate 40 may at least partially overlap.

By overlapping of the above circuit structures, the space occupied by the sensor circuits in the display region may be reduced, thereby increasing the number and density of sensors. Also, the first sensor circuit 31 where the first-type thin film transistors are located and the second sensor circuit 32 where the second-type thin film transistors may be driven by the same row, and the control signals may be consistent. Therefore, the wiring space between different types of transistors may be greatly reduced, improving the design resolution of the embedded fingerprint recognition image and improving the sensor recognition efficiency and accuracy.

In some embodiments shown in FIG. 1 and FIG. 2, a plurality of scan lines may be disposed in the display region 20, and at least two sensor circuits 30 in the display region 20 may be connected to one same scan line Scan_L, such as the reset control signal line Scan_rst or the read control signal line Scan_read. A plurality of shift registers 190 may be disposed in the non-display region 10, and at least two sensor circuits 30 may be electrically connected to one same shift register 190. One driving circuit unit may at least include one display pixel circuit 33 and two sensor circuits 30. The transistor M1 in the first sensor circuit 31 of the sensor circuits 30 and the transistor M1' in the second sensor circuit 32 may be electrically connected to the same shift register 190 through the reset control signal line Scan_rst, and the transistor M3 in the first sensor circuit 31 and the transistor M3' in the second sensor circuit 32 may be electrically connected to the same shift register 190 through the read control signal line Scan_read. The display region 20 may be an array formed by a plurality of driving circuit units. The first sensor circuit 31 may include a photosensitive diode PD_(i~i+1), the second sensor circuit 32 may include a photosensitive diode PD_(i+1), and each sensor circuit may be electrically connected to the same scan line Scan_L. Each drive circuit unit may at least include two sensor circuits 30. Each sensor circuit 30 in the driving circuit units of one same column may be electrically connected to the same output signal line. Through the structure of the above circuit sharing the scanning line Scan_L and the identification data line Vdata_(i), the wiring space may be reduced, thereby improving the quantity and density of the sensors.

Figure 7:
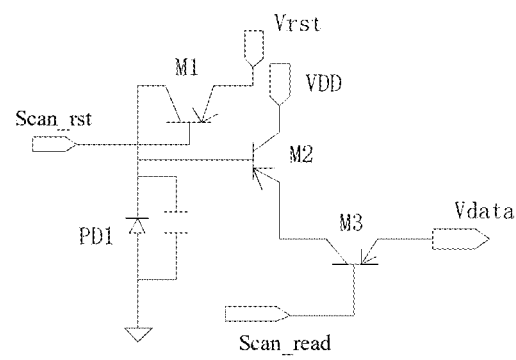
FIG. 7 illustrates a structure of a first-type sensor circuit in a display region of an exemplary display panel consistent with various disclosed embodiments in the present disclosure.
Figure 10:
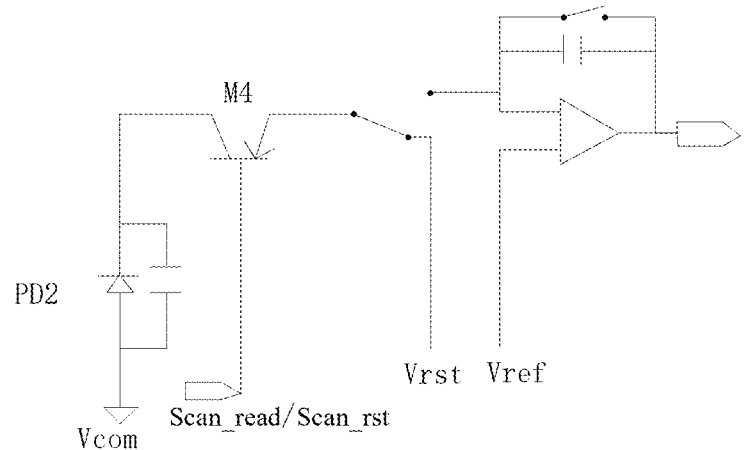
FIG. 10 illustrates a structure of a second-type sensor circuit in a display region of another exemplary display panel consistent with various disclosed embodiments in the present disclosure.

In some embodiments shown in FIG. 7 and FIG. 10, each sensor circuit may be independently selected from any one of a first-type sensor circuit and a second-type sensor circuit. As shown in FIG. 7, in one embodiment, one first-type sensor circuit may include a first photosensitive device PD1, a first transistor M1, a second transistor M2, a third transistor M3 and a first voltage signal line Vrst. The reset control signal line Scan_rst may be electrically connected to the control electrode of the first transistor M1. The read control signal line Scan_read may be electrically connected to the control electrode of the third transistor M3. The first voltage signal line Vrst may be electrically connected to the first electrode of the first transistor M1, the second voltage signal line VDD may be electrically connected to the first electrode of the second transistor M2, the identification data line Vdata may be electrically connected to the second electrode of the third transistor M3. The second electrode of the second transistor M2 may be electrically connected to the first electrode of the third transistor M3, and the second electrode of the first transistor M1 and the control electrode of the second transistor M2 may be both electrically connected to the first photosensitive device PD1. As shown in FIG. 10, one second-type sensor circuit may include a second photosensitive device PD2 and a fourth transistor M4. The control electrode of the fourth transistor M4 may be electrically connected to the reset/read control line Scan_rst/Scan_read. The first electrode of the fourth transistor M4 may be electrically connected to the second photosensitive device PD2, and the second electrode of the fourth transistor M4 may be electrically connected to the input/output signal. When connected to the input signal line, the input signal line may be electrically connected to the first voltage signal line Vrst, and when connected to the output signal line, the input signal line may be electrically connected to the reset line Vref.

Figure 8:
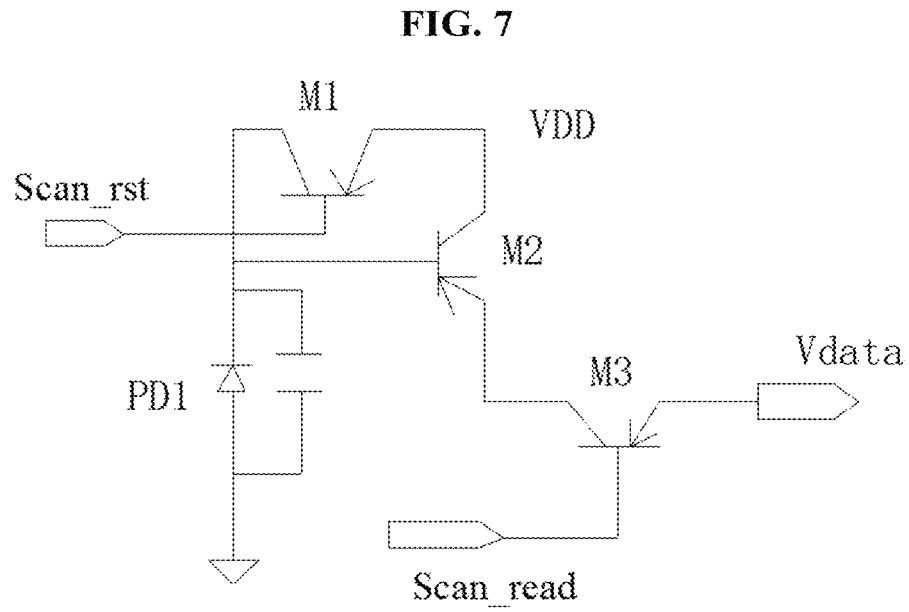
FIG. 8 illustrates a structure of a first-type sensor circuit in a display region of another exemplary display panel consistent with various disclosed embodiments in the present disclosure.

As shown in FIG. 7 and FIG. 8, the control electrode, the first electrode and the second electrode of the first transistor in the first-type sensor circuit may be electrically connected to the reset control signal line Scan_rst, the first voltage signal line Vrst and the first photosensitive device PD1 respectively. The control electrode, the first electrode and the second electrode of the second transistor M2 may be respectively electrically connected to the first photosensitive device PD1, the second voltage signal line VDD and the first electrode of the third transistor M3. The control electrode, the first electrode and the second electrode of the third transistor M3 may be electrically connected to the read control signal line Scan_read, the second electrode of the second transistor M2 and the identification data line Vdata respectively. As shown in FIG. 7, when the first voltage signal line Vrst and the second voltage signal line VDD are electrically connected to different power supply voltage, they may transmit different signals. As shown in FIG. 8, when the first voltage signal line Vrst and the second voltage signal line VDD are electrically connected to the same power supply voltage, they may transmit the same signal.

Figure 9:
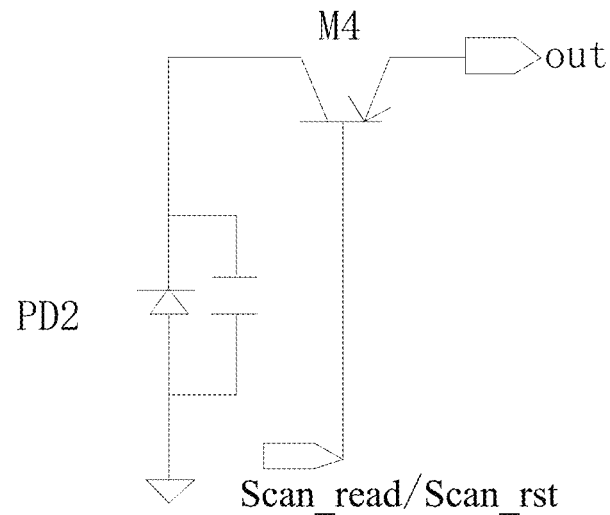
FIG. 9 illustrates a structure of a second-type sensor circuit in a display region of an exemplary display panel consistent with various disclosed embodiments in the present disclosure.

As shown in FIG. 9 and FIG. 10, the control electrode, first electrode and second electrode of the fourth transistor M4 in the second-type sensor circuit may be electrically connected to the reset/read control line Scan_rst/Scan_read, the second photosensitive device PD2, and the input/output signal line respectively. As shown in FIG. 9, the second electrode of the fourth transistor M4 may be electrically connected to the output signal line OUT. As shown in FIG. 10, when the second electrode of the fourth transistor M4 is electrically connected to the reset control signal line Scan_rst, the second electrode may serve as an input signal line to input signals into the circuit.

Figure 11:
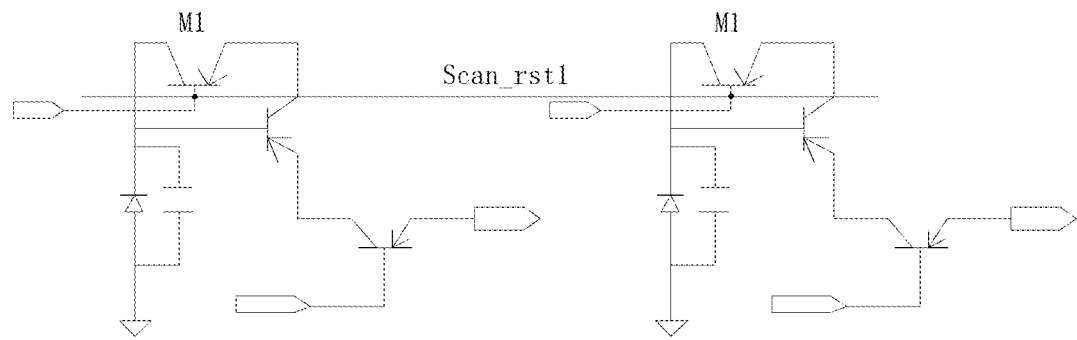
FIG. 11 illustrates a partial structure of multiple first-type sensor circuits sharing a scan line consistent with various disclosed embodiments in the present disclosure.
Figure 12:
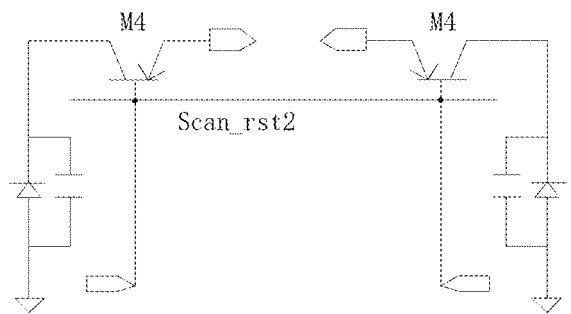
FIG. 12 illustrates a partial structure of multiple second-type sensor circuits sharing a scan line consistent with various disclosed embodiments in the present disclosure.
Figure 13:
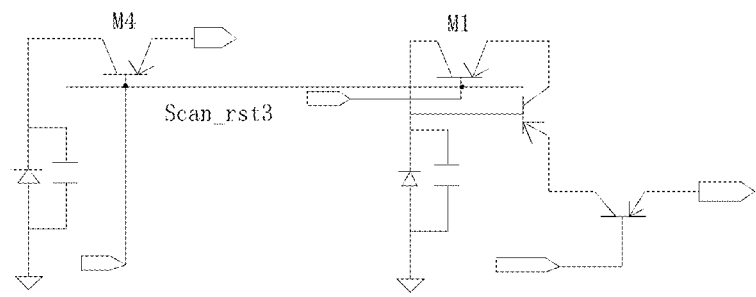
FIG. 13 illustrates a partial structure of first-type sensor circuits and second-type sensor circuits sharing a scan line consistent with various disclosed embodiments in the present disclosure.

As shown in FIG. 11 to FIG. 13, the display region may include a plurality of sensor circuits arranged in an array. The plurality of sensor circuits may include a plurality of first-type sensor circuits located in the same row. As shown in FIG. 11, the control electrode of each first transistor M1 may be electrically connected to the same reset control signal line Scan_rst1. Or, the plurality of sensor circuits may include a plurality of second-type sensor circuits located in the same row. As shown in FIG. 11, the control electrode of each fourth transistor M4 may be electrically connected to the same reset control signal line Scan_rst2. As shown in FIG. 13, the plurality of sensor circuits may include at least one first-type sensor circuit and at least one second-type sensor circuit located in the same row. The control electrode of each first transistor M1 and the control electrode of each fourth transistor M4 may be all electrically connected to the same reset control signal line Scan_rst3. By configuring at least one first transistor M1 and/or at least one fourth transistor M4 to be driven in the same row, the control signals may be consistent, such that the space occupied by the wiring between the first transistor M1 and the fourth transistor M4 may be greatly reduced.

Figure 14:
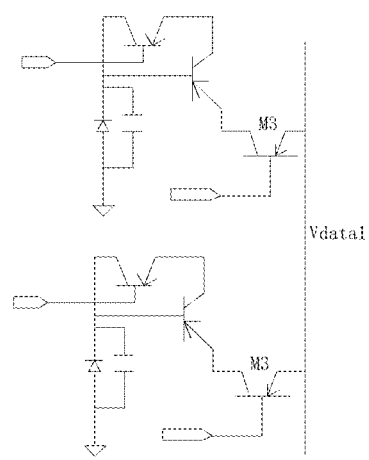
FIG. 14 illustrates a partial structure of multiple first-type sensor circuits sharing an output signal line consistent with various disclosed embodiments in the present disclosure.
Figure 15:
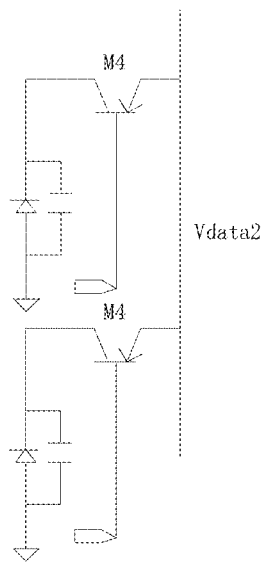
FIG. 15 illustrates a partial structure of multiple second-type sensor circuits sharing an output signal line consistent with various disclosed embodiments in the present disclosure.
Figure 16:
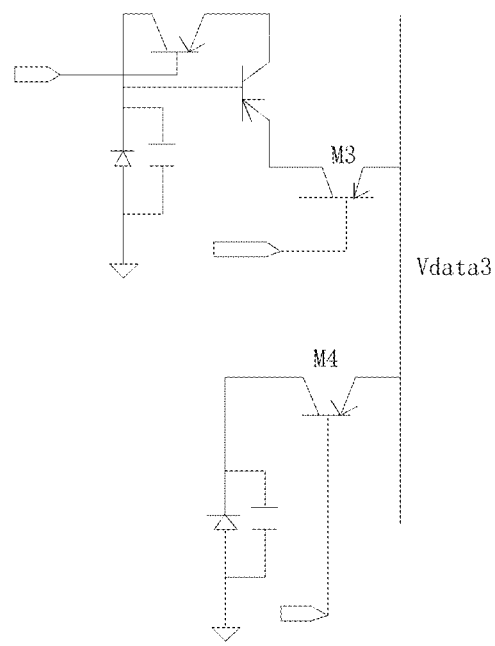
FIG. 16 illustrates a partial structure of first-type sensor circuits and second-type sensor circuits sharing an output signal line consistent with various disclosed embodiments in the present disclosure.

The display region may include a plurality of sensor circuits arranged in an array. The plurality of sensor circuits may include a plurality of first-type sensor circuits located in the same row. As shown in FIG. 14, the second pole of each transistor M3 may be electrically connected to the same identification data line Vdata1. Or, the plurality of sensor circuits may include a plurality of second-type sensor circuits located in the same column. As shown in FIG. 15, the second electrode of each fourth transistor M4 may be electrically connected to the same identification data line Vdata2. Or, the plurality of sensor circuits may include at least one first-type sensor circuit and at least one second-type sensor circuit located in the same column. As shown in FIG. 16, the second electrode of each third transistor M3 and the second pole of each fourth transistor M4 may be electrically connected to the same identification data line Vdata3. By configuring at least one third transistor M3 and/or at least one fourth transistor M4 to be driven in the same row, the control signals may be consistent, such that the wiring space occupied between the third transistor M3 and the fourth transistor M4 may be greatly reduced.

Figure 17:
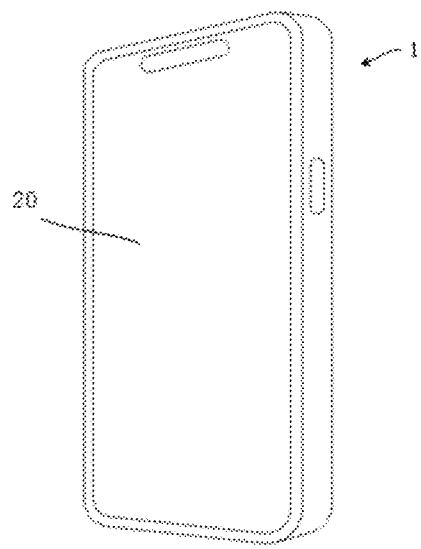
FIG. 17 illustrates an exemplary display device consistent with various disclosed embodiments in the present disclosure.

The present disclosure also provides a display device. As shown in FIG. 17, the display device 1 may include a display panel provided by various embodiments of the present disclosure, and the display panel may include a display region 20 according to the above embodiments.

In the display device provided by the present disclosure, the sensor circuits integrated in the display panel may be configured to include different types of transistors. At least two of the sensor circuits may be arranged in the same row in the display panel and may share the same row driver. Therefore, the space occupied by wirings between different types of transistors in the display device may be greatly reduced, reducing the space occupied by the sensor circuits in the display region. The number and density of sensors in the display device may be increased, and the recognition efficiency and accuracy of the sensors in the display device may be improved.

In the present disclosure, relational terms such as "first" and "second" are only used to distinguish one entity or operation from another entity or operation, and do not necessarily require or imply that there is a relationship between these entities or operations. There is no such actual relationship or sequence. Furthermore, the terms "comprises", "include", or any other variations thereof are intended to cover a non-exclusive inclusion such that a process, method, article, or apparatus that includes a list of elements includes not only those elements, but also those not expressly listed, or elements inherent to the process, method, article or equipment. Without further limitation, an element defined by the statement "comprises a . . . " does not exclude the presence of additional identical elements in a process, method, article, or apparatus that includes the stated element.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising a display region and a non-display region at least partially surrounding the display region, wherein:
   the display region includes a plurality of sensor circuits, wherein at least two sensor circuits in the plurality of sensor circuits include different types of transistors;
   the plurality of sensor circuits includes a first sensor circuit and a second sensor circuit;
   at least one transistor in the first sensor circuit is a first-type thin film transistor, and at least one transistor in the second sensor circuit is a second-type thin film transistor;
   the first-type thin film transistor includes an active layer located in an oxide semiconductor layer;
   the second-type thin film transistor includes an active layer located in a silicon semiconductor layer;
   the plurality of sensor circuits is disposed on a substrate;
   the first sensor circuit and the second sensor circuit at least partially overlap in a direction perpendicular to a plane of the substrate; and
   in the direction perpendicular to the plane of the substrate, the oxide semiconductor layer in the first-type thin film transistor has a first projection, and the silicon semiconductor layer in the second-type thin film transistor has a second projection, wherein the first projection and the second projection at least partially overlap.

2. The display panel according to claim 1, wherein:
   in the direction perpendicular to the plane of the substrate, a first gate of the first-type thin film transistor has a third projection, wherein the first projection and the third projection at least partially overlap.

3. The display panel according to claim 1, wherein:
   in the direction perpendicular to the plane of the substrate, a second gate of the second-type thin film transistor has a fourth projection, wherein the second projection and the fourth projection at least partially overlap.

4. The display panel according to claim 1, wherein:
   in the direction perpendicular to the plane of the substrate, a first gate of the first-type thin film transistor has a third projection, and a second gate of the second-type thin film transistor has a fourth projection, wherein the third projection and the fourth projection at least partially overlap.

5. The display panel according to claim 1, wherein:
   the display region further includes a plurality of scan lines;
   the non-display region includes a plurality of shift registers; and
   at least two of the plurality of sensor circuits are electrically connected to a same one of the plurality of shift registers through a same one of the plurality of scan lines.

6. The display panel according to claim 5, wherein:
   the display region includes a plurality of drive circuit units;
   at least one drive circuit unit of the plurality of drive circuit units includes at least one display pixel circuit and two sensor circuits; and
   the sensor circuits in the at least one drive circuit unit are electrically connected to a same one of the plurality of shift registers through a same one of the plurality of scan lines.

7. The display panel according to claim 6, wherein:
the plurality of the drive circuit units is arranged in an array, and sensor circuits in the drive circuit units in a same row are electrically connected to a same one of the plurality of scan lines.

8. The display panel according to claim 6, wherein:
the plurality of the drive circuit units is arranged in an array, and sensor circuits in the drive circuit units in a same row are electrically connected to a same output signal line.

9. The display panel according to claim 5, wherein:
each sensor circuit is independently selected from any one of a first-type sensor circuit or a second-type sensor circuit;
the first-type sensor circuit includes a first photosensitive device, a first transistor, a second transistor, a third transistor, and a first voltage signal line, wherein:
the reset control signal line is electrically connected to a control electrode of the first transistor, the read control signal line is electrically connected to a control electrode of the third transistor, the first voltage signal line is electrically connected to a first pole of the first transistor, the second voltage signal line is electrically connected to a first pole of the second transistor, the output signal line is electrically connected to a second pole of the third transistor; a second electrode of the second transistor is electrically connected to a first electrode of the third transistor, and the second electrode of the first transistor and the control electrode of the second transistor are both electrically connected to the first photosensitive device;
and
the second-type sensor circuit includes a second photosensitive device and a fourth transistor, wherein: a control electrode of the fourth transistor is electrically connected to the reset/read control line, a first electrode of the fourth transistor is electrically connected to the second photosensitive device, and the second pole of the fourth transistor is electrically connected to the input/output signal line.

10. The display panel according to claim 9, wherein:
the display region further includes a transfer layer;
the first-type thin film transistor includes a first gate;
the second-type transistor includes a second gate;
the transfer layer is located on a side of the first gate and the second gate away from the substrate; and
the transfer layer includes a first transfer structure electrically connected to the scan line, the first gate and the second gate.

11. The display panel according to claim 10, wherein:
the transfer layer further includes a second transfer structure, a third transfer structure and a fourth transfer structure;
the second transfer structure and the third transfer structure are connected to the first photosensitive device;
the fourth transfer structure is connected to the second photosensitive device;
the first electrode of the first-type thin film transistor and the first electrode of the second-type thin film transistor are respectively connected to the second transfer structure;
the second electrode of the first-type thin film transistor is connected to the third transfer structure; and
the second electrode of the second-type thin film transistor is connected to the fourth transfer structure.

12. The display panel according to claim 1, further including a plurality of photosensitive devices, a plurality of thin film transistors, and a plurality of light-emitting devices on a same side of the substrate, wherein:
the display region further includes display pixel circuits;
one display pixel circuit includes at least one of the plurality of light-emitting devices and at least one of the plurality of thin film transistors; and
each of the first sensor circuit and the second sensor circuit includes one of the plurality of photosensitive devices and multiple thin film transistors of the plurality of thin film transistors.

13. The display panel according to claim 12, wherein:
the display pixel circuit includes a fifth transistor;
all of the transistors in the first sensor circuit are the first-type thin film transistors;
a gate of the fifth transistor and the gate of the first-type thin film transistor are located in a same layer; and
the active layer of the fifth transistor and the active layer of the first-type thin film transistor are both located in the oxide semiconductor layer.

14. The display panel according to claim 13, wherein:
the display pixel circuit includes a sixth transistor;
the transistors in the second sensor circuit are all the second-type thin film transistors;
a gate of the sixth transistor and the gate of the second-type thin film transistor are located in a same layer; and
the active layer of the sixth transistor and the active layer of the second-type thin film transistor are both located in the silicon semiconductor layer.

15. The display panel according to claim 1, wherein:
one sensor circuit of the plurality of sensor circuits is a fingerprint recognition circuit.

16. A display device comprising a display panel, wherein:
the display panel includes a display region and a non-display region at least partially surrounding the display region;
the display region includes a plurality of sensor circuits, wherein at least two sensor circuits in the plurality of sensor circuits include different types of transistors;
the plurality of sensor circuits includes a first sensor circuit and a second sensor circuit;
at least one transistor in the first sensor circuit is a first-type thin film transistor, and at least one transistor in the second sensor circuit is a second-type thin film transistor;
the first-type thin film transistor includes an active layer located in an oxide semiconductor layer;
the second-type thin film transistor includes an active layer located in a silicon semiconductor layer;
the plurality of sensor circuits is disposed on a substrate;
the first sensor circuit and the second sensor circuit at least partially overlap in a direction perpendicular to a plane of the substrate; and
in the direction perpendicular to the plane of the substrate, the oxide semiconductor layer in the first-type thin film transistor has a first projection, and the silicon semiconductor layer in the second-type thin film transistor has a second projection, wherein the first projection and the second projection at least partially overlap.

* * * * *